(12) United States Patent
Howley

(10) Patent No.: US 6,862,379 B2
(45) Date of Patent: Mar. 1, 2005

(54) EXTINCTION RATIO CONTROL OF A SEMICONDUCTOR LASER

(75) Inventor: James P. Howley, Broomfield, CO (US)

(73) Assignee: Agere Systems, Inc., Allentown, PA (US)

( * ) Notice: Subject to any disclaimer, the term of this patent is extended or adjusted under 35 U.S.C. 154(b) by 49 days.

(21) Appl. No.: 10/616,332

(22) Filed: Jul. 9, 2003

(65) Prior Publication Data

US 2005/0008280 A1 Jan. 13, 2005

(51) Int. Cl.$^7$ .............................. G02B 6/12; G02B 6/00; H01S 5/0683
(52) U.S. Cl. .................... 385/14; 385/147; 372/29.021; 398/140; 250/227.14
(58) Field of Search ............................... 372/6, 18, 38, 372/29.021; 385/2–24, 147; 398/142, 143, 140, 141; 250/227, 214 R, 227.16, 227.18, 227.19, 227.27, 227.14

(56) References Cited

U.S. PATENT DOCUMENTS

| | | | | |
|---|---|---|---|---|
| 5,965,308 A | * | 10/1999 | Ozawa | 430/30 |
| 6,580,531 B1 | * | 6/2003 | Swanson et al. | 398/5 |
| 6,590,644 B1 | * | 7/2003 | Coin et al. | 356/218 |
| 6,591,025 B1 | * | 7/2003 | Choi et al. | 385/12 |
| 6,641,662 B2 | * | 11/2003 | Radojevic et al. | 117/2 |
| 6,661,817 B1 | * | 12/2003 | Ames et al. | 372/29.021 |
| 6,676,304 B1 | * | 1/2004 | Coin et al. | 385/89 |
| 6,697,750 B1 | * | 2/2004 | Coin et al. | 702/108 |
| 2003/0010275 A1 | * | 1/2003 | Radojevic et al. | 117/2 |
| 2003/0169790 A1 | * | 9/2003 | Chieng et al. | 372/34 |
| 2004/0044489 A1 | * | 3/2004 | Jones et al. | 702/79 |

* cited by examiner

Primary Examiner—Akm Enayet Ullah
(74) Attorney, Agent, or Firm—Nancy R. Gamburd

(57) ABSTRACT

The present invention provides a method and apparatus, such as an integrated circuit, to control the extinction ratio of a semiconductor laser and maintain the extinction ratio substantially constant at a predetermined level. Apparatus embodiments include a semiconductor laser, a modulator, a photodetector, and an extinction ratio controller. The semiconductor laser is capable of transmitting an optical signal in response to a modulation current. The modulator is capable of providing the modulation current to the semiconductor laser, with the modulation current corresponding to an input data signal. The photodetector, which is optically coupled to the semiconductor laser, is capable of converting the optical signal into a photodetector current. The extinction ratio controller, in response to the photodetector current, is capable of adjusting the modulation current provided by the modulator to the semiconductor laser to generate the optical signal having substantially a predetermined extinction ratio.

34 Claims, 5 Drawing Sheets

EXTINCTION RATIO CONTROL OF A SEMICONDUCTOR LASER

CROSS-REFERENCE TO A RELATED APPLICATION

This application is related to an application of Jonathan H. Fischer and James P. Howley, U.S. patent application Ser. No. 10/616,334, entitled "Optical Midpoint Power Control and Extinction Ratio Control of a Semiconductor Laser", filed concurrently herewith, commonly assigned to Agere Systems, Inc., and incorporated by reference herein, with priority claimed for all commonly disclosed subject matter (the "related application").

FIELD OF THE INVENTION

The present invention relates, in general, to semiconductor laser systems and, more particularly, to an apparatus and method for controlling an extinction ratio of a semiconductor laser.

BACKGROUND OF THE INVENTION

Semiconductor lasers, such as laser diodes, produce coherent light waves at a wide variety of wavelengths of the electromagnetic spectrum, and are ideal for many applications, such as optical fiber communication and network systems, laser printers, bar code scanners, compact disc players, etc. Laser diodes and other laser semiconductors generally include an active layer or region, using materials such as, for example, gallium arsenide, gallium indium arsenide, gallium nitride, variations of these materials including zinc oxide and/or phosphorous, or another direct bandgap semiconductor material. Because laser diodes also can be directly modulated at high frequencies (e.g., at several GHz), through modulation of their "drive current", laser diodes are often used in high speed communication and other networking applications, such as for data transmission, voice communication, multimedia applications, and so on.

Laser performance, including the optical output power provided by the laser, however, varies due to a number of factors including, for example, the laser temperature, the age of the semiconductor laser, and process variations in semiconductor laser fabrication. Such performance variations include a change in the laser transfer function, namely, a change in laser output power ("L") for a given laser diode current ("I") (forward bias current). These changes in output power and forward bias current characteristics may be represented graphically as: (1) a shift in a graphical slope of the transfer function (laser output power versus forward bias current (L-I slope)) characterizing the semiconductor laser; and (2) a shift in the laser threshold current (i.e., the level of forward bias current at which the semiconductor laser first demonstrates coherent radiation).

As a consequence, such laser performance variations also cause undesirable variations in an "extinction ratio", which is defined as the ratio of the optical output power resulting from transmission by the semiconductor laser of a signal representing a data logical 1 (or high), at a first (or comparatively higher) power level, to the optical output power resulting from transmission by the semiconductor laser of a signal representing a data logical 0 (or low), at a second (or comparatively lower) power level (i.e., the ratio of the first power level for a logical one to the second power level for a logical zero). Laser performance variations which diminish the extinction ratio, as a consequence, cause undesirable variations in the signal-to-noise ratio (SNR) of the system. For example, as the L-I slope characterizing the semiconductor laser decreases for given forward bias and modulation currents, the difference between optical 1 (high) signal power and the optical 0 (low) signal power decreases, degrading the signal-to-noise ratio.

One aspect of maintaining appropriate signal-to-noise ratios, in light of laser performance variations, may be achieved by maintaining a substantially or significantly constant extinction ratio. Prior art attempts to maintain such a constant extinction ratio include use of an open loop adjustment to a laser diode's operating points, based on the laser die temperature and a look-up table. Unfortunately, such an open loop system provided no guarantee that the corresponding adjustments to the operating points were yielding the desired effect of maintaining a constant extinction ratio, and did not account for the effects of laser aging. In addition, in the open loop system, accurate characterization of the laser was required to program the look-up table, process variations were unaccounted for unless each system was programmed independently, and the laser driver's die temperature may not accurately represent the semiconductor laser's operating temperature.

Another prior art attempt to maintain a constant extinction ratio superimposed a low frequency modulation to the transmit power level associated with an optical 1, and then using resulting data, calculated the laser diode's L-I slope to approximate the extinction ratio and provide some form of correction. See Bosch et al. U.S. Pat. No. 5,373,387, "Method for Controlling the Amplitude of an Optical Signal", issued Dec. 13, 1994; and Bosch et al. U.S. Pat. No. 5,448,629, "Amplitude Detection Scheme for Optical Transmitter Control", issued Sep. 5, 1995. Unfortunately, this extinction ratio determination method was inaccurate, as correction to the extinction ratio was sensitive to non-linearity (curvature) in the semiconductor laser's transfer function characteristics, and the method did not directly determine the actual extinction ratio.

As a consequence, a need remains for an apparatus and method to control the extinction ratio of a semiconductor laser.

SUMMARY OF THE INVENTION

The present invention provides an apparatus and method for a semiconductor laser to generate an optical signal having a substantially constant, predetermined extinction ratio. The various apparatus embodiments, such as circuit embodiments, include a semiconductor laser, a modulator, a photodetector, and an extinction ratio controller (having a sampler and a modulation current controller).

In the various embodiments, the semiconductor laser, such as a laser diode, is capable of transmitting an optical signal having a first optical power level in response to a first modulation current level and having a second optical power level in response to a second modulation current level, with the first optical power level being greater than the second optical power level. The modulator, which is coupled to the semiconductor laser, is capable of providing the first modulation current level to the semiconductor laser when the input data signal has a first logical state, such as a logical one, and providing the second modulation current level to the semiconductor laser when the input data signal has a second logical state, such as a logical zero, with the first modulation current level being greater than the second modulation current level.

The photodetector is optically coupled to the semiconductor laser, and is capable of generating a first photodetector current level in response to the first optical power level and a second photodetector current level in response to the second optical power level. The extinction ratio controller, consisting of a sampler and a modulation current controller, is coupled to the photodetector and to the modulator. The sampler portion of the extinction ratio controller is capable of sampling the first photodetector current level to form a first photodetector current indicator and sampling the second photodetector current level to form a second photodetector current indicator. The modulation current controller portion of the extinction ratio controller is capable of determining a measured extinction ratio as a ratio of the first photodetector current indicator to the second photodetector current indicator; determining a variance between the measured extinction ratio and a predetermined extinction ratio and, based on the variance, forming an extinction ratio error signal; and in response to the extinction ratio error signal, is further capable of adjusting the modulation current provided by the modulator to the semiconductor laser to generate the optical signal substantially having the predetermined extinction ratio.

Depending on the bandwidth (or responsiveness) of the photodetector or other component (i.e., how quickly the photodetector settles to an accurate current level in response to the optical signal), the sampler may also include a timer capable of enabling the sampling of the first photodetector current level when the input data signal has a predetermined number of consecutive bits having the first logical state and enabling the sampling of the second photodetector current level when the input data signal has a predetermined number of consecutive bits having the second logical state. Alternatively, the timer is capable of enabling the sampling of the first photodetector current level when the input data signal has the first logical state for a predetermined period of time and enabling the sampling of the second photodetector current level when the input data signal has the second logical state for the predetermined period of time.

In various embodiments, the sampler is further capable of sampling the first photodetector current level to form a plurality of first photodetector current indicators and sampling the second photodetector current level to form a plurality of second photodetector current indicators. For this embodiment, the modulation current controller is further capable of determining the measured extinction ratio as a ratio of a first arithmetic mean of the plurality of first photodetector current indicators to a second arithmetic mean of the plurality of second photodetector current indicators, and determining a variance between the measured extinction ratio and the predetermined extinction ratio, and based on the variance, forming the extinction ratio error signal.

In response to the extinction ratio error signal in various forms, the modulation current may be controlled in several ways, such as by the modulation current controller providing a modulation adjustment signal to the modulator for the modulator to vary its current levels, or by the modulation current controller directly varying the modulation current levels of the modulator. In one embodiment, the modulation current controller is further capable of integrating the extinction ratio error signal with a plurality of previous extinction ratio error signals to form an integrated extinction ratio error signal, and is further capable of adjusting the modulation current by providing a selected current path for the modulator, of a plurality of varied or variable current paths, with the selected current path corresponding to the integrated extinction ratio error signal. In another embodiment, the modulation current controller is capable of providing, in response to the extinction ratio error signal or an integrated extinction ratio error signal, a modulation (current) adjustment signal to the modulator, and in response to the modulation current adjustment signal, the modulator is capable of adjusting the first modulation current level and the second modulation current level for the semiconductor laser to generate the optical signal having substantially the predetermined extinction ratio.

Numerous other advantages and features of the present invention will become readily apparent from the following detailed description of the invention and the embodiments thereof, from the claims and from the accompanying drawings.

BRIEF DESCRIPTION OF THE DRAWINGS

Figure (or FIG.) 1 is a block diagram of an exemplary first apparatus embodiment in accordance with the present invention.

Figure (or FIG.) 2 is a graphical illustration of an exemplary transfer function for a semiconductor laser.

Figure (or FIG.) 3 is a block and circuit diagram of an exemplary second apparatus embodiment in accordance with the present invention.

Figure 4A:
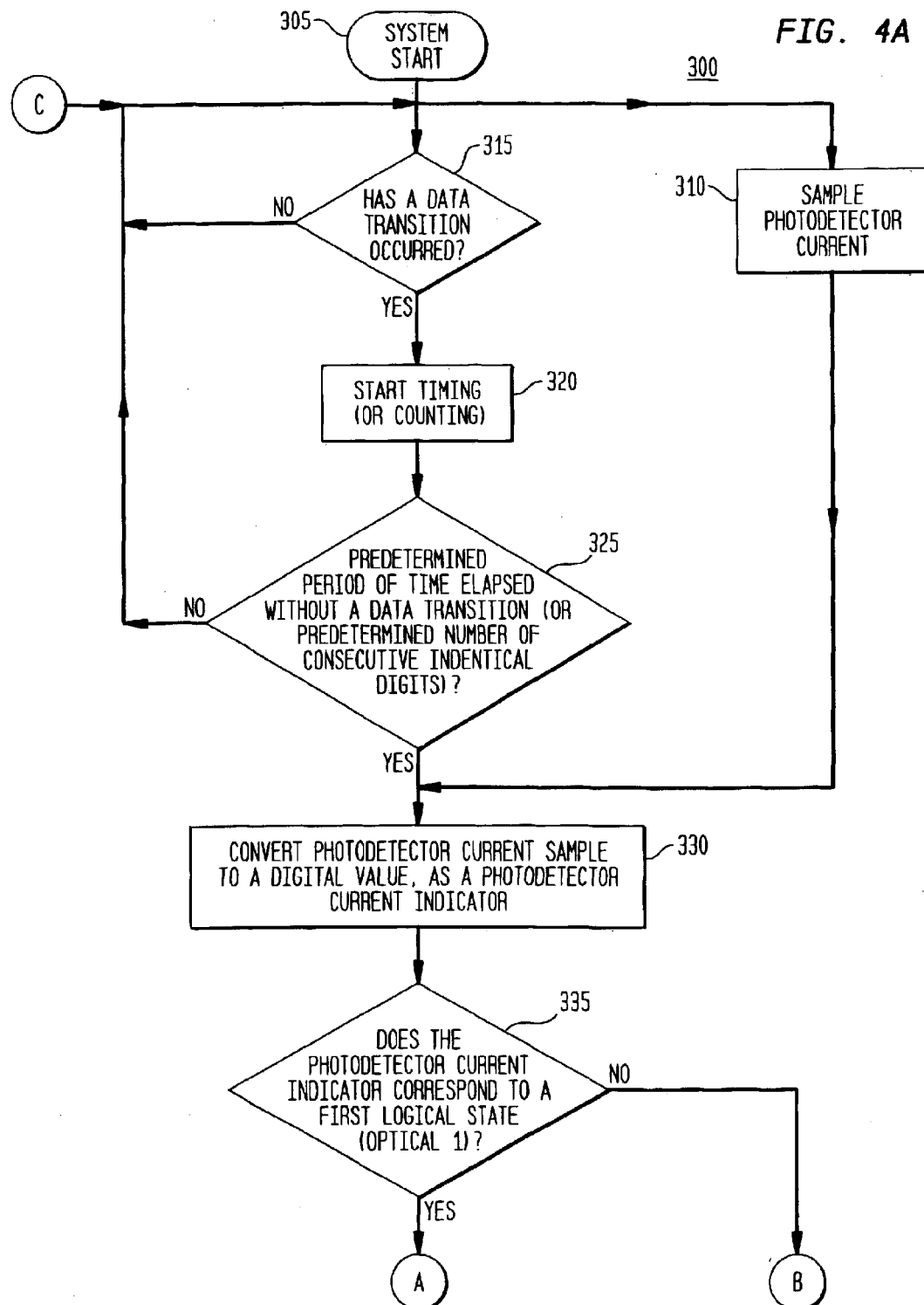
Figure 4B:
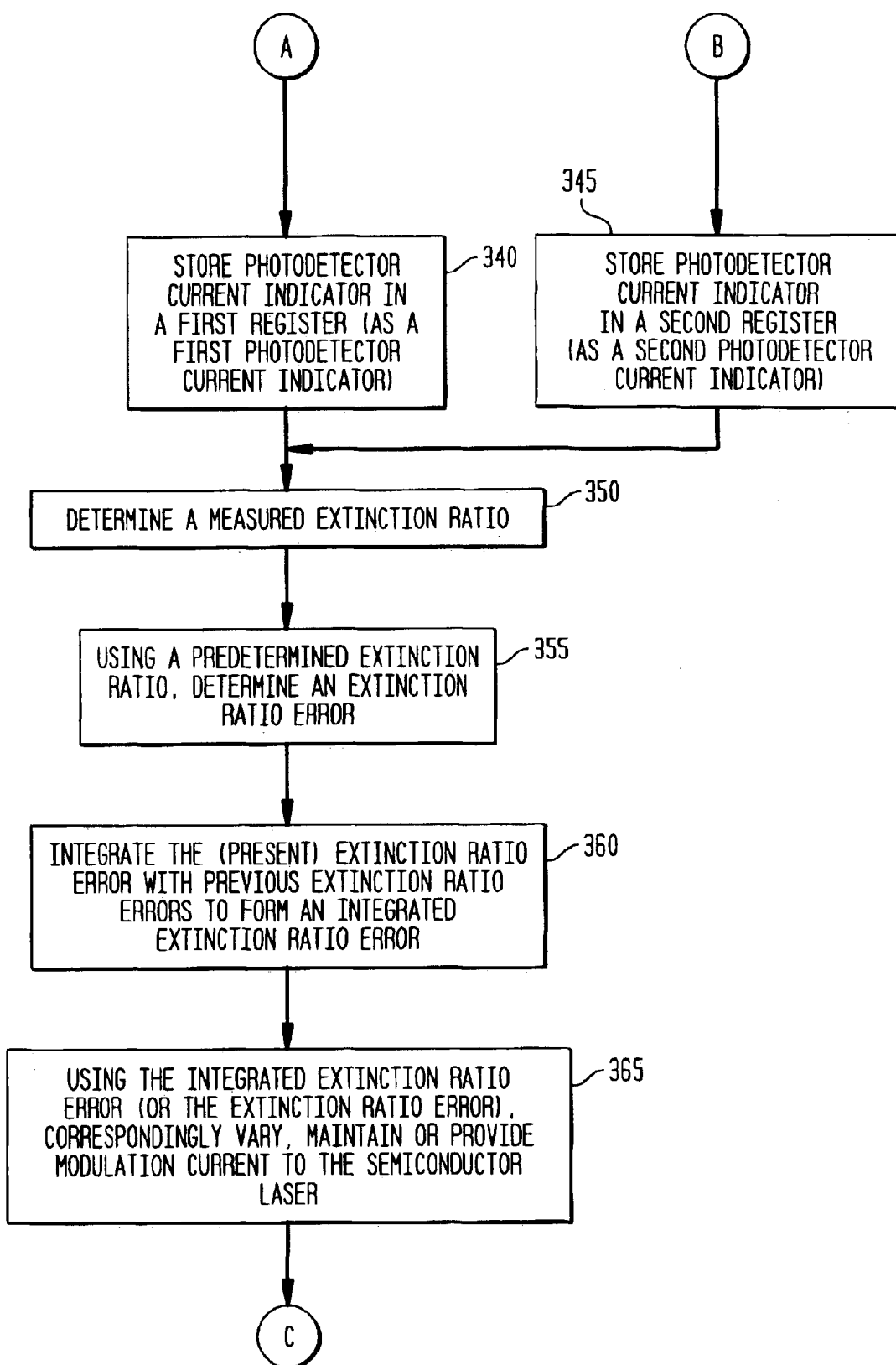

FIGS. 4A and 4B, individually and collectively referred to as Figure (or FIG.) 4, are flow diagrams of an exemplary method embodiment in accordance with the present invention.

DETAILED DESCRIPTION OF THE INVENTION

While the present invention is susceptible of embodiment in many different forms, there are shown in the drawings and will be described herein in detail specific embodiments thereof, with the understanding that the present disclosure is to be considered as an exemplification of the principles of the invention and is not intended to limit the invention to the specific embodiments illustrated.

As mentioned above, the present invention provides an apparatus and method for controlling the extinction ratio of a semiconductor laser. As discussed in greater detail below, the present invention provides for adjusting a modulation current of a laser diode to generate an optical output signal having a substantially constant, predetermined extinction ratio. As a consequence, the various embodiments of the present invention provide significant compensation for the changing characteristics of semiconductor lasers, maintaining the quality of the laser optical output at predetermined or user selected levels.

Figure 1:
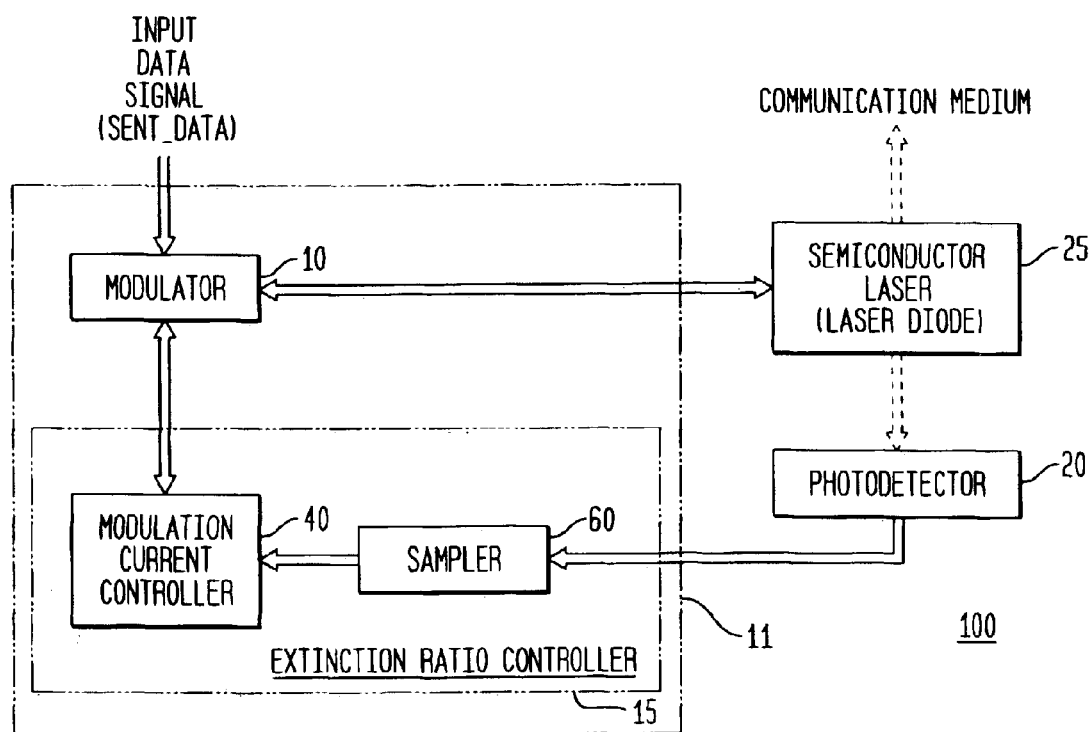

FIG. 1 is a block diagram of an exemplary first apparatus embodiment 100 in accordance with the present invention. The exemplary apparatus 100 may be embodied as an integrated circuit, or as a portion of an integrated circuit having other, additional components. Typically, the apparatus 100 is embodied with a semiconductor laser and photodetector as discrete components, and the remainder of the apparatus as an integrated circuit, with all such discrete or integrated embodiments considered equivalent and within the scope of the present invention.

Referring to FIG. 1, the apparatus 100 includes a semiconductor laser such as a laser diode 25, a modulator 10, a photodetector 20, and an extinction ratio controller 15. The modulator 10 and the extinction ratio controller 15 may be considered to comprise a "laser driver" 11 which controls the operation of the laser diode 25. The extinction ratio controller 15 includes a sampler 60 and a modulation current controller 40. The modulator 10 provides a modulation current to the laser diode 25, in response to an input data signal (illustrated as "SENT_DATA"), providing a first level of modulation current (i.e., a first modulation current or first modulation current level) when the input data signal has a first logical state, and a second level of modulation current (i.e., a second modulation current or second modulation current level) when the input data signal has a second logical state. These first and second logical states of the input signal, equivalently, may be corresponding voltage levels, and reference to either a logical state or voltage level shall mean and include reference to the other.

In response to these levels of modulation current (and, as discussed below, having an additional forward bias current), the laser diode 25 is operative to transmit an optical signal corresponding to the input data signal (with the transmitted or output optical signal representing first and second logical states referred to as "optical 1's" and "optical 0's", respectively). As mentioned above, when the input data signal is a logical one or high, the optical output signal has a first optical power level, and when the input data signal is a logical zero or low, the optical output signal has a second optical power level. While the first optical power level is generally greater than the second optical power level, alternative logical assignments of data to power levels may be utilized within the scope of the present invention. As discussed in greater detail below, the amount or level of both first and second modulation currents provided by the modulator 10 to the laser diode 25, for the first optical power level and the second optical power level, respectively, is determined by the extinction ratio controller 15.

A semiconductor laser, such as laser diode 25, emits coherent radiation from both a forward facet and a rear facet of the active layer. While not separately illustrated, the forward facet of the laser diode 25 is typically optically coupled to a communication or other transmission medium, such as an optical fiber, to transmit a data signal (as the optical output signal). The photodetector 20 is positioned at the rear facet for illumination by the laser diode 25, so that the photodetector 20 generates a corresponding photodetector current used for monitoring of the optical output signal power of the laser diode 25 by the extinction ratio controller 15, as discussed below.

The optical output signal power from the laser diode 25, as indicated above, varies between the first optical power level and the second optical power level in accordance with the input data signal. The photodetector 20, optically coupled to the laser diode 25, converts the varying optical output signal power into a correspondingly varying photodetector current. As a consequence, the photodetector current varies with and tracks the laser output signal power, specifically varying with the first optical power level and the second optical power level. The extinction ratio controller 15 of the invention, coupled to the photodetector 20 and the modulator 10, uses this corresponding photodetector current to determine how the laser diode 25 is performing. More specifically, the sampler 60 samples the photodetector current, and based on the photodetector current level, the extinction ratio controller 15 (through the modulation current controller 40) will determine whether the laser diode 25 is providing output signal power having the appropriate, selected or predetermined extinction ratio, and will adjust the levels of modulation current provided to the laser diode 25 accordingly. For example, if the extinction ratio controller 15 determines that the currently provided extinction ratio is low, it will increase either or both the first and second levels of modulation current to drive the laser diode 25 at correspondingly higher power levels to achieve the selected or predetermined extinction ratio. Over time, these adjustments to the modulation current will be in ever smaller increments, and as discussed in greater detail below, will then cause the laser diode 25 to generate and maintain over time an optical output signal having a significantly or substantially constant extinction ratio.

It should be noted that the laser diode current is maintained above the lasing threshold for both the first optical power level (optical 1) and the second optical power level (optical 0) to avoid an undesirable phenomenon commonly referred to in the art as turn-on time jitter or laser chirp. The various embodiments of the invention, therefore, include provision of a forward bias current to the laser diode 25, in addition to the provision of modulation current by the modulator 10.

The modulation current, more specifically, may be considered to be a first modulation current or first modulation current level, referred to herein as an $I_{MOD}$ (1) current, provided by the modulator 10 to the laser diode 25 for transmission of an optical 1 (logical one) at the first, higher optical power level, and a second modulation current or second modulation current level, referred to herein as an $I_{MOD}$ (0) current, provided by the modulator 10 to the laser diode 25 for transmission of an optical 0 (logical zero) at the second, lower optical power level. Therefore, the total current flowing through the laser diode 25 may be represented as a sum of the DC forward bias current, plus either a first modulation current ($I_{MOD}$ (1) current or current level) or a second modulation current ($I_{MOD}$ (0) current or current level), depending on whether transmission of an optical 1 or an optical 0 is required (based on the input data signal). These current levels and corresponding optical output signal power levels are also illustrated graphically in FIG. 2, and are discussed below.

Figure 2:
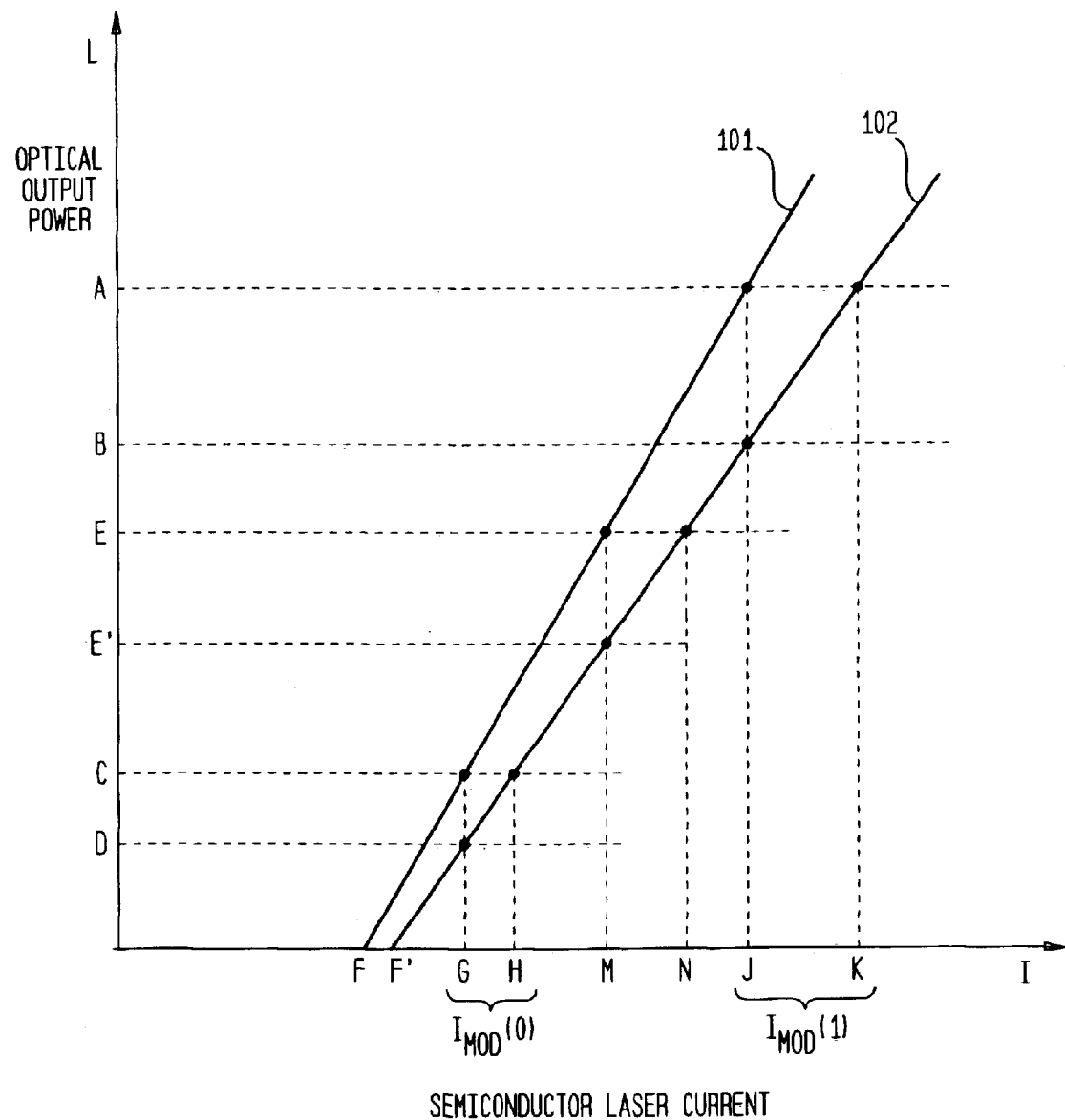

FIG. 2 is a graphical illustration of an exemplary transfer function for a semiconductor laser, illustrated as optical output power (L) as a function of laser diode 25 current (I) (forward bias current plus modulation current). As illustrated in FIG. 2, the desired or predetermined extinction ratio is A/C (on line 101), as a ratio of a first optical power level of "A" to a second optical power level of "C", using respective (corresponding) current levels of "J" (forward bias current plus $I_{MOD}$ (1) current) and "G" (forward bias current plus $I_{MOD}$ (0) current).

It should be noted that there are typically several different ways to combine the forward bias current and the various modulation currents ($I_{MOD}$ (1) current and $I_{MOD}$ (0) current), namely, through DC coupling or AC coupling (illustrated with reference to FIG. 3). For DC coupling (and with reference to the transfer function illustrated as line 101), the forward bias current may be set to a level of "G", directly providing a current level associated with an optical 0, with $I_{MOD}$ (0) current equal to zero and $I_{MOD}$ (1) current equal to an amount (J−G). Alternatively and equivalently for DC coupling, the forward bias current may be set to a lasing threshold level of "F", with $I_{MOD}$ (0) current equal to an amount (G−F) and $I_{MOD}$ (1) current equal to an amount (J−F). Also alternatively and equivalently, for AC coupling (and with reference to the transfer function illustrated as line 101), the forward bias current may be set to a midpoint level of "M" (with the optical output power level midpoint "E" determined as the arithmetic average of the optical 1 ("A") level and the optical 0 ("C") level ((A+C)/2)), with $I_{MOD}$ (0) current equal to a negative value of magnitude (M−G) (i.e., −(M−G)), and $I_{MOD}$ (1) current equal to a positive value of magnitude (J−M).

Because laser diode performance varies over time, due to processing, aging, temperature of the laser diode, and so on, optical output power levels of the optical 1's and 0's also vary over time. As illustrated (on line 102), optical output power levels have decreased for the same laser current levels, with the same current levels now providing an extinction ratio of B/D, as a ratio of a first optical power level of "B" to a second optical power level of "D" (also using respective current levels of "J" and "G"). As will be apparent from FIG. 2, such a change in the laser diode transfer function (laser performance) may be illustrated as a change in the slope of the L vs. I graph of FIG. 2 (and further illustrates a change in the modulation currents required to provide an optical 0 or an optical 1 at a desired optical output power levels). In addition, there may also be a change in the threshold current, from F to F'.

In accordance with the present invention, to accommodate these variations in the laser diode characteristics (or transfer function characteristics) which may occur, the change in extinction ratio will be determined, as a measured extinction ratio, and adjustments in modulation current levels by the extinction ratio controller 15 are then used in order to maintain the extinction ratio at a substantially constant, predetermined level. To maintain the predetermined extinction ratio of A/C, corresponding modulation current levels are changed, using a first modulation current level (with forward bias current) of "K" for the first optical power level (forward bias current plus $I_{MOD}$ (1) current) and a second modulation current level (with forward bias current) of "H" for the second optical power level (forward bias current plus $I_{MOD}$ (0) current).

As mentioned above, there are typically several different ways to combine the forward bias current and the various modulation currents ($I_{MOD}$ (1) current and $I_{MOD}$ (0) current). For DC coupling (and with reference to the transfer function illustrated as line 102), the forward bias current may be set to a level of "H", directly providing a current level associated with an optical 0, with $I_{MOD}$ (0) current equal to zero and $I_{MOD}$ (1) current equal to an amount (K–H). Alternatively and equivalently for DC coupling, the forward bias current may be set to a lasing threshold level of "F'", with $I_{MOD}$ (0) current equal to an amount (H-F') and $I_{MOD}$ (1) current equal to an amount (K–F'). Also alternatively and equivalently, for AC coupling (and with reference to the transfer function illustrated as line 102), the forward bias current may be set to a new midpoint level of "N", with $I_{MOD}$ (0) current equal to a negative value of magnitude (N–H) (i.e., –(N–H)), and $I_{MOD}$ (1) current equal to a positive value of magnitude (K–N).

As disclosed in the related application, in actual operation, the extinction ratio controller 15 operates in conjunction with an optical midpoint controller (not separately illustrated) which provides the functionality of the forward bias current generator 65 to determine and provide the forward bias current for the laser diode 25. For example, such an optical midpoint controller will provide a forward bias current of F, G or M (for the various alternatives discussed with reference to the transfer function illustrated as line 101), and will provide a forward bias current of F', H or N (for the various alternatives discussed with reference to the transfer function illustrated as line 102). Depending upon the DC or AC embodiment, the extinction ratio controller 15 then provides the corresponding modulation currents ($I_{MOD}$ (1) current and $I_{MOD}$ (0) current) discussed above to maintain a substantially constant, predetermined extinction ratio of A/C, as illustrated in FIG. 2.

Referring again to FIG. 1, the apparatus 100 utilizes the photodetector 20 to detect the optical output signal power from the laser diode 25 and to convert the detected optical output signal power into a corresponding (electrical) photodetector current (i.e., the current through the photodetector 20 corresponds to and tracks the optical output signal). Using the photodetector current (as a form or type of signal) from the photodetector 20, the extinction ratio controller 15: (1) measures or otherwise determines the extinction ratio (discussed below in detail) presently being provided by the laser diode 25; (2) compares the measured extinction ratio with a selected, desired or predetermined extinction ratio; and (3) if and when the measured extinction ratio varies from the selected or predetermined extinction ratio, adjusts the first and second modulation current levels (via feedback through the modulator 10) to cause the laser diode 25 to generate an optical output signal having the predetermined extinction ratio, and over time, having a substantially constant, predetermined extinction ratio (i.e., the first power level and the second power level of the optical output signal form a substantially constant, predetermined extinction ratio).

When the extinction ratio controller 15 has determined that the measured extinction ratio varies from the selected or predetermined extinction ratio, there are innumerable different ways in which feedback to the modulator 10 may be provided to vary the modulation current supplied to the laser diode 25. In many instances, depending upon the implementation of the modulator 10, the type of feedback selected will vary accordingly. For example, as discussed below with reference to FIG. 3, when the modulator 10 is implemented as a switching arrangement or differential amplifier (of modulator 110), the extinction ratio controller 15 is implemented (as extinction ratio controller 115) to provide a selected current path for the modulator, of a plurality of varied or variable current paths, with the selected current path corresponding to the desired level of current flow for the modulator, thereby allowing more or less current through the modulator 10 and laser diode 25 to achieve the predetermined extinction ratio. Other forms of varying the modulation of the laser diode 25 current may include, for example, switching one or more current paths to vary the modulation current, driving associated transistors at various voltage levels to provide varying current flow (such as varying the voltages at the bases or gates of driving transistors of a modulator), providing variable resistance levels in a current path, and so on. As a consequence, it will be understood by those of skill in the art that all such implementations and their variations are considered equivalents hereto and are within the scope of the present invention.

Figure 3:
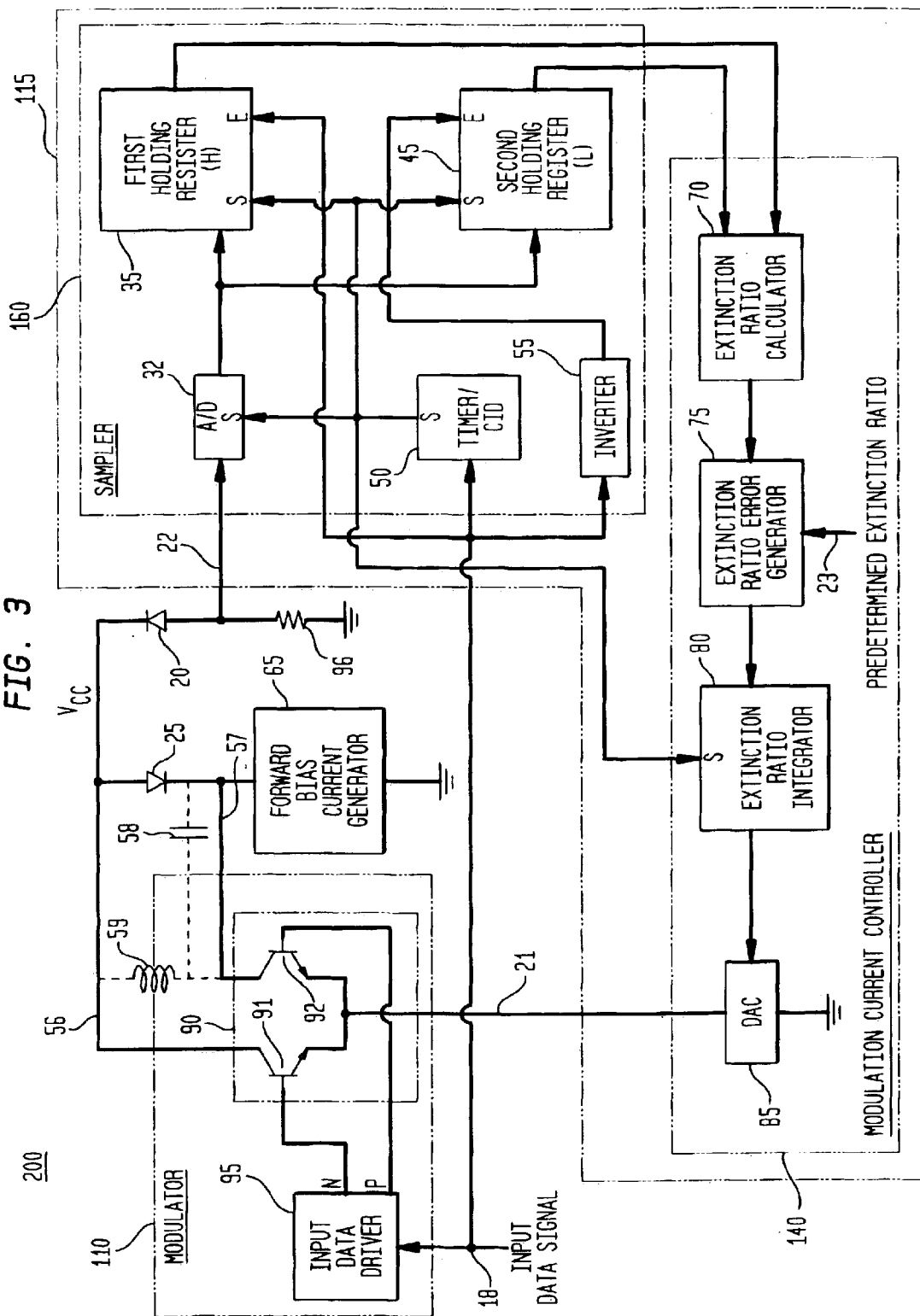

FIG. 3 is a block and circuit diagram of an exemplary second apparatus embodiment 200 in accordance with the present invention. The exemplary second apparatus 200 may be embodied as an integrated circuit, or as a portion of an integrated circuit having other, additional components. Typically, the apparatus 200 is also embodied with a semiconductor laser and photodetector as discrete components, and the remainder of the apparatus as an integrated circuit, with all such discrete or integrated embodiments considered equivalent and within the scope of the present invention.

Similarly to the apparatus 100 discussed above, the second apparatus 200 also includes a semiconductor laser such as the laser diode 25, a photodetector 20, an extinction ratio controller 115 and a modulator 110. The modulator 110 and the extinction ratio controller 115 also may be considered to comprise a "laser driver" which controls the operation of the laser diode 25. As illustrated, the second apparatus 200 also includes a forward bias current generator 65, to provide a selected or predetermined level of forward bias current, as discussed above. While the input data signal (e.g., SENT_

DATA) is provided to the modulator 110 (on line 18), in this embodiment, the input data signal is also provided as one of the inputs to the extinction ratio controller 115 (namely, to the timer/CID 50, the inverter 55, and register 35). The extinction ratio controller 115 also has inputs of the photodetector current (on line or input 22), along with the input of a value for the predetermined or selected extinction ratio (as a device setting, on line or input 23), and has an output (on line or output 21) to the modulator 110.

It should be noted that the input of the photodetector current may be viewed or represented equivalently as a voltage level produced by the photodetector current through a known impedance, such as resistor 96 (such as for sampling of the voltage level representing the photodetector current by analog-to-digital converter ("A/D converter") 30); as a consequence, as used herein, the photodetector current (or photodetector current level) may be considered to equivalently mean and refer to the voltage level produced by the photodetector current through a known impedance (e.g., resistor 96). A power supply voltage, Vcc, is provided to the laser diode 25 on line 56. Also as will be appreciated by those of ordinary skill in the art, any of a plurality of types of semiconductor lasers and photodetectors may be used equivalently herein.

Also as discussed above with reference to FIG. 1, the modulator 110 provides a modulation current to the laser diode 25, in response to an input data signal (on line or input 18), providing a first level of modulation current (a first modulation current or $I_{MOD}$ (1)) when the input data signal has a first logical state, and a second level of modulation current (a second modulation current or $I_{MOD}$ (0)) when the input data signal has a second logical state. In response to these levels of modulation current (and, having a forward bias current from generator 65), the laser diode 25 is capable of transmitting an optical signal (representing first and second logical states (optical 1's and optical 0's)) corresponding to the input data signal. As mentioned above, when the input data signal is a logical one or high, the optical output signal has a first optical power level, and when the input data signal is a logical zero or low, the optical output signal has a second optical power level. Again, while the first optical power level is generally greater than the second optical power level, alternative logical assignments of data to optical power levels may be utilized within the scope of the present invention. Also, the amount or level of both the first modulation current and the second modulation current provided by the modulator 110 to the laser diode 25, for the first optical power level and the second optical power level, respectively, is determined by the extinction ratio controller 115.

The modulator 110 includes an input data driver (or drive circuit) 95 that receives the input data signal, and a differential amplifier 90 coupled to an output of the input data drive circuit 95. As illustrated, the bases of the transistors 91 and 92 comprising differential amplifier 90 are each coupled to an output of the input data driver 95, receiving input "N" (as an inverse of the input data (or DATA−)) and input "P" (as the input data (or DATA+)), which correspond to the first and second logic states of the input data signal. For example, as illustrated, the input data driver 95 converts the input data signal into a form suitable for use by the differential amplifier 90, such that the differential amplifier 90 is capable of providing the first modulation current level to the laser diode 25 when the input data signal has a first logical state (logical 1) and the second modulation current to the laser diode 25 when the input data signal has a second logical state (logical 0) (e.g., via transistors 91 and 92, as inputs "N" and "P", respectively). The differential amplifier 90 also may be considered equivalently to be a comparator or a switching arrangement, and numerous other equivalent implementations of modulator 110 will be apparent to those of skill in the art, as mentioned above. For purposes of the present invention, the modulator 110 need only provide current to the laser diode 25 for the laser diode to have appropriate first and second output optical power levels, in response to the input data signal. In addition, the modulator 110 of the invention should either, depending upon the selected embodiment: (1) be responsive to any adjustment signal or other information (such as a modulation adjustment signal) from the extinction ratio controller 115 to change the first or second modulation currents, such as, for example, by driving any applicable transistors at a different voltage levels to allow different levels of current flow; or (2) as discussed below, be configured to allow the extinction ratio controller 115 to directly change these modulation current levels, such as by providing a selected current path, of a plurality of varied or variable current paths, with the selected current path corresponding to the desired level of modulation current to achieve the predetermined extinction ratio.

The modulator 110 (through differential amplifier 90) may also have either an AC or DC coupling to the laser diode 25. As illustrated, when the collector of transistor 92 is coupled (via line 57) to the laser diode 25, DC coupling is provided. Alternatively, in lieu of DC coupling via line 57, AC coupling may be provided utilizing a capacitor 58 coupled between the laser diode 25 and the collector of transistor 92 and utilizing an inductor 59 coupled between the power supply voltage (Vcc on line 56) and the collector of the transistor 92, as illustrated with the dotted lines in FIG. 3.

As in FIG. 1, the sampler 160 of the extinction ratio controller 115 of FIG. 3 has an input of the photodetector current (as a voltage level) from the photodetector 20, and in addition, an input of the input data signal. The extinction ratio controller 115 measures or determines a presently (i.e., currently) occurring extinction ratio (discussed below in detail), and if the measured extinction ratio varies from the predetermined extinction ratio, adjusts the modulation current to cause the laser diode to generate an optical output signal having the predetermined extinction ratio. The measured (or determined) extinction ratio, as a numerical value, is based on (1) a currently measured, optical power level, and (2) a previously measured and stored optical power level that represents a logical opposite of the currently measured optical power level. For example, when the currently measured optical output signal is at or about the first optical power level and represents a logical or optical one, then the previously measured and stored optical power level which is used to form the measured extinction ratio is for an optical output signal that is at or about the second optical power level and which represents a logical or optical zero. Similarly, when the currently measured optical output signal is at or about the second optical power level and represents a logical or optical zero, then the previously measured and stored optical power level which is used to form the measured extinction ratio is for an optical output signal that is at or about the first optical power level and which represents a logical or optical one.

The extinction ratio controller 115 includes a sampler 160 (equivalently a voltage or a current sampler) and a modulation current controller 140. The sampler 160 includes an analog-to-digital converter ("A/D converter") 30 coupled to the photodetector 20, a first (high) holding register 35 coupled to an output of the A/D converter 30, a second (low) holding register 45 coupled to the output of the A/D converter 30, a timer/CID 50, and an inverter 55. The A/D converter 30 receives as input the photodetector current (generally as a voltage, as discussed above). When indicated (or enabled) by the timer/CID 50 (as discussed below), the A/D converter 30 samples the photodetector current (generally, as a corresponding voltage level) and converts the sampled photodetector current (or voltage) into a digital form or digital value, referred to as a photodetector current indicator.

When enabled or indicated by the timer/CID 50, the A/D converter 30 provides a photodetector current indicator, as a digital value, corresponding to the photodetector current sample at that instant in time. As mentioned above, equivalently, the photodetector current may be monitored and sampled as a corresponding voltage level. The photodetector current at that instant in time corresponds to the optical output power of either a first logical state (logical 1) or a second logical state (logical 0). The timer/CID 50 indicates (as a timing signal, indicator or enable (illustrated as enable "S")) to the A/D converter 30 that the photodetector current should be sampled (and converted to a photodetector current indicator) when the input data signal indicates that a transition between first and second logical states has not occurred for a predetermined time period or for a predetermined number of bits (discussed below). When there has not been such a transition for a predetermined period of time or a predetermined number of hits (e.g., a certain number of consecutive bits have been identical, either all first logical states (1's) or all second logical states (0's)), the A/D converter 30 then samples the photodetector current and converts the photodetector current sample into a digital form, referred to as a photodetector current indicator, suitable for use by the modulation current controller 140. Alternatively, the A/D converter 30 may continually sample the photodetector current, and convert the sampled photodetector current to a digital form, as a photodetector current indicator, only when similarly enabled by the timer/CID 50.

The timing indication or enable signal from the timer/CID 50 to sample the photodetector current and/or convert the sample to a photodetector current indicator is based on the "settling" time (or time to reach a steady-state) of the photodetector and sampler in the apparatus 200, which may be measured as a duration of time or as a sequential number of transmitted bits. Typically, the slowest component will be the photodetector 20, which requires a particular amount of time to receive light at either the first optical power level or the second optical power level to then produce a consistent, corresponding photodetector current which is representative of each of these power levels. As a consequence, the timer/CID 50 is set for the photodetector 20 and A/D converter 32 (of sampler 160) to settle, and is independent of the speed of the other components of the apparatus 200 illustrated in FIG. 3. The timer/CID 50 may be configured to determine either that a sufficient number of successive bits of the same logical state (consecutive logical 1's or logical 0's, as consecutive identical digits or "CIDs") have been received by the photodetector 20 (as corresponding to the input data signal), or that a sufficient period of time has elapsed for the receipt by the photodetector 20 of consecutive logical 1's or logical 0's. It should be noted that this timing or counting process is applicable to any slowest component, which may or may not be the photodetector 20. This use of the timer/CID 50, however, does permit the use of a photodetector 20 which is comparatively slower and has a comparatively more limited bandwidth (and, generally, may also be implemented at lower cost).

As a consequence, when either a predetermined period of time has elapsed or transmission of a predetermined number of bits having the same logical state (CID) has occurred, the timer/CID 50 will provide a corresponding indication or signal, referred to as a timing signal or timing enable. This timing signal is provided to a plurality of the components of the extinction ratio controller 115, as illustrated, namely, the A/D converter 30, the registers 35, 45, and the extinction ratio integrator 80. When indicated by the timer/CID 50, the digital value representing a sample of a settled photodetector output current then provides a basis for accurate measurement of the actual extinction ratio being provided by the laser diode 25. As a consequence, the timing signal is provided to enable the A/D converter 30, the registers 35, 45, and the extinction ratio integrator 80, thereby providing that these components are enabled only when the current sample is considered accurate and valid. In the absence of the timing signal or timing enable, these components do not provide additional data for use in determining a measured extinction ratio and controlling the modulation current, such that the modulation current then remains at its previous levels (i.e., the modulation current remains at its most recent first and second modulation current levels).

As indicated above, the photodetector current indicator corresponds to either a first optical power level representative of a first logical state. (logical 1) or a second optical power level representative of a second logical state (logical 0). Given that at least one photodetector current indicator for the first optical power level and at least one photodetector current indicator for the second optical power level are needed to determine the extinction ratio, as these values are determined over time based on the data transmitted, the values are stored in separate, corresponding registers, with a first holding register 35 storing one or more photodetector current indicators of the first optical power level and with a second holding register 45 storing one or more photodetector current indicators of the second optical power level. As the photodetector current indicator from the A/D converter 30 may be for either the first optical power level or the second optical power level, the input data signal is utilized (with inverter 55) to correspondingly enable either the first holding register 35 or the second holding register 45 (via inverter 55) to store the photodetector current indicator (illustrated as enable "E"). For ease of reference, the photodetector current indicator corresponding to the first optical power level is referred to as a first photodetector current indicator, and the photodetector current indicator corresponding to the second optical power level is referred to as a second photodetector current indicator. For example, when enabled by the timing signal from the timer/CID 50, the digital value for the photodetector current sample is stored in the first holding register 35 when enabled by the input data signal (as indicating a logical 1), as a first photodetector current indicator, or is stored in the second holding register 45 when enabled by the inverted input data signal (as indicating a logical 0 which has been inverted by inverter 55), as a second photodetector current indicator. Depending upon the selected embodiment, the first holding register 35 may store a plurality of samples of the photodetector current for the first logical state, as a plurality of first photodetector current indicators, and the second holding register 45 may store a plurality of samples of the photodetector current for the second logical state, as a plurality of second photodetector current indicators.

Continuing to refer to FIG. 3, the modulation current controller 140 comprises an extinction ratio calculator 70, an extinction ratio error generator 75, an extinction ratio integrator 80, and a digital-to-analog converter ("DAC") 85.

The extinction ratio calculator 70 is coupled to the first and second holding registers 35, 45, and determines the measured extinction ratio of the laser diode 25. As discussed in greater detail below, the extinction ratio calculator 70 may determine the measured extinction ratio as: (1) a ratio of a singular first photodetector current indicator to a singular second photodetector current indicator (i.e., forming a ratio using a single sample of each of the photodetector current indicators which correspond to the first optical power level and the second optical power level); or (2) as a ratio of a first average value or arithmetic mean of a plurality of first photodetector current indicators to a second average value or arithmetic mean of a plurality of second photodetector current indicators (i.e., forming a ratio using a plurality of samples of each of the photodetector current indicators corresponding to the first optical power level and the second optical power level).

The extinction ratio error generator 75 has a first input coupled to the extinction ratio calculator 70, and has a second input (on line 23) to receive a predetermined or preset extinction ratio value which has been selected or which is desired for the optical output power levels of the laser diode 25. The extinction ratio error generator 75 will determine a difference (or other variance), if any, between the predetermined extinction ratio and the measured extinction ratio, and provide a corresponding extinction ratio error signal. For example, the extinction ratio error generator 75 may be implemented as an adder (subtracter) or summer, subtracting the measured extinction ratio from (or adding an inverted measured extinction ratio to) the predetermined extinction ratio. The extinction ratio error signal has both a magnitude, as the absolute value of any difference between the predetermined extinction ratio and the measured extinction ratio, and has a sign, such that it will be positive when the measured extinction ratio is less than the predetermined extinction ratio, and will be negative when the measured extinction ratio is greater than the predetermined extinction ratio.

Subject to the various caveats discussed below, the extinction ratio error (signal) will then provide the basis for determining or varying the first and second modulation current levels of the modulator 110 to maintain a substantially constant, predetermined extinction ratio (i.e., a substantially constant extinction ratio at a predetermined level). How the extinction ratio error is utilized will depend upon the selected embodiment of the modulator 110, as mentioned above. For example, in an embodiment in which the modulator were to provide the first and second modulation currents directly to the laser diode 25, the extinction ratio error signal (or as discussed below, its integrated form, as an integrated extinction ratio error signal) may be provided directly to the modulator, as a modulation current adjustment signal, for use by the modulator in directly varying the first and second modulation currents of the laser diode 25 to provide a substantially constant, predetermined extinction ratio.

For the illustrated embodiment, however, the extinction ratio controller 115 determines the overall or total amount of current through the modulator 110 and, in particular, through the differential amplifier (or switching arrangement) 90. Within the modulation current controller 140, the DAC 85 is coupled to the modulator 110 and provides this current control function; because the modulator 110 must always have at least some current to modulate the laser diode 25 in response to the input data signal, in this embodiment the DAC 85 always provides at least some current to the modulator 110, with the amount of current dependent upon, among other things, the predetermined extinction ratio and the extinction ratio error signal. To force the steady state extinction ratio error towards zero and filter the extinction ratio error signal to minimize control loop effects on the transmitted signal, the extinction ratio error signal is not provided directly to the modulator 110 to, for example, directly vary first and second modulation currents. Rather, the extinction ratio error signal is integrated (or summed) with previous error values by extinction ratio integrator 80. This integration of the extinction ratio error signal with previous error values by extinction ratio integrator 80, to form an integrated extinction ratio error signal, is utilized by the DAC 85 to determine an overall or total level of modulation current for the modulator 110, and provides that a corresponding positive, but variable, modulation current level is provided by the DAC 85 to the modulator 110.

As mentioned above, the integration by the extinction ratio integrator 80 is enabled by the timing signal (timing enable), such that a valid extinction ratio error signal is utilized before a change may be made to the integrated extinction ratio error signal, with corresponding effects on the modulation current levels. The DAC 85, in turn, as a variable current source/sink, then provides that indicated level of modulation current, corresponding to the integrated extinction ratio error signal, to the modulator 110. More particularly, using the integrated extinction ratio error signal, the DAC 85 converts the integrated extinction ratio error signal to a corresponding analog value indicative of the appropriate level of modulation current, and provides a corresponding, selected current path (or current sink) from the modulator 110 to a ground potential (of a plurality of varied or variable current paths), and thereby allows a corresponding level of modulation current to flow through the modulator 110 in order for the first optical power level and the second optical power level of the laser diode 25 to have the predetermined extinction ratio. For example, the DAC 85 may provide a plurality of switchable current paths having differing impedance/resistance levels, and using control provided by the integrated extinction ratio error signal, will therefore provide different levels of current capacity when switched in or out of the path between the modulator 110 and ground, e.g., with lower resistance paths allowing increased modulation current levels, and so on. It will be apparent to those of skill in the art that myriad other equivalent DAC 85 implementations are also available.

It will be apparent to those of skill in the art that when the modulator 110 may be implemented using other equivalent arrangements, the DAC 85 (as a variable current source or sink) will be varied accordingly and, in some cases, the extinction ratio error may or may not need to be integrated or summed prior to being used to indicate or provide modulation current levels. In such an equivalent embodiment, when an entity separate from a modulator (such as the DAC 85) is not providing all of the current to the modulator, the extinction ratio error signal may be applied directly to a modulator (for the modulator to vary its own current levels, as mentioned above), as or as part of a modulation adjustment signal. Numerous other equivalent variations also will be apparent to those of skill in the art, and are within the scope of the present invention.

As a consequence, using the first and second photodetector current indicators (as digital values of photodetector current samples), or using corresponding averages of a plurality of each of the first and second photodetector current indicators, the modulation current controller 140 determines or measures the extinction ratio of the laser diode 25 (through extinction ratio calculator 70), and compares (or determines the variance between) the measured extinction ratio and the predetermined extinction ratio (through extinction ratio error generator 75). In the event the measured extinction ratio varies from the predetermined extinction ratio, an extinction ratio error signal is generated, and is used to vary the modulation current accordingly. In the illustrated embodiment, the extinction ratio error signal is used to vary the amount of modulation current provided by the DAC 85 to the modulator 110, by providing an indicator of the total or overall modulation current level to be provided, as the integrated extinction ratio error signal from the extinction ratio integrator 80. As a consequence, due to this feedback arrangement, any variance between the measured extinction ratio and the predetermined extinction ratio is forced toward zero and becomes negligible, resulting in the laser diode 25 having a substantially constant extinction ratio at the predetermined or selected level, namely, a substantially constant and predetermined extinction ratio.

It should be noted that the various apparatuses 100 and 200 may be implemented using a wide range of equivalents. For purposes of example and not limitation, the extinction ratio controller may be implemented utilizing: an A/D converter or other sampler; any type of memory (such as random access memory (RAM), flash, DRAM, SRAM, SDRAM, MRAM, FeRAM, ROM, EPROM or $E^2$PROM); a microprocessor (or digital signal processor, controller or other processor) programmed or configured to determine the measured extinction ratio, error, integrated error, and so on; and a variable current source or varied and switchable current paths; while the modulator, laser diode and photodetector may be implemented using known architectures and components, in addition to those illustrated. Numerous other equivalent implementations also will be apparent to those of skill in the art.

FIGS. 4A and 4B, individually and collectively referred to as FIG. 4, are flow diagrams of an exemplary method embodiment 300 in accordance with the present invention, and provides a useful summary. In the exemplary embodiment, the method is performed on a continual basis during operation of the apparatus 100 or apparatus 200, beginning with system or apparatus start up (step 305), adjusting the modulation current flowing through the laser diode 25, as needed, in order to generate an optical output signal having a substantially constant, predetermined extinction ratio. In addition, the illustrated method embodiment 300 utilizes the continual sampling of the photodetector current by the A/D converter 30, as mentioned above (rather than the other alternative of sampling only when specifically enabled by the timing signal).

Referring to FIG. 4, the photodetector current is sampled on a continuous basis, step 310, by the A/D converter 30. Concurrently, in step 315, the method determines whether an input data transition has occurred, in which successive or consecutive bits of the input data signal transition from one logical state to another logical state (e.g., a bit transition from a logical 0 to a logical 1 or vice-versa). When the input data transitions from one logical state to another in step 315, the timer/CID 50 is reset or initialized, to begin timing or counting from zero or another equivalent reference or initialization point (step 320). The method then determines whether a predetermined or minimum time period has elapsed (or a predetermined consecutive identical bit count has been reached) without another (or next) data transition, step 325, allowing for steady-state (or settled) levels to be reached, such as for the photodetector current. If the predetermined or minimum time period or bit count has not been reached before another data transition has occurred in step 325, the method returns to steps 310 and 315, to reset the timer or counter while continually sampling the photodetector current.

When the predetermined or minimum time period or bit count has been reached without another data transition in step 325, the sample of the photodetector current (from step 310) is converted to a digital form, as a photodetector current indicator, step 330. For example, the timer/CID 50 may "time out" and provide a timing or enable signal, indicating that the present photodetector current sample should be converted to digital form and used in subsequent extinction ratio and error determinations. As mentioned above, the predetermined time period or bit count is selected to allow the components of the apparatus 100 or 200 to settle, if needed. Although the photodetector 20 (with its limited bandwidth) is typically the slowest component to settle, there may be instances where the speed of the photodetector 20 is not a factor and therefore use of the timer/CID 50 is optional (i.e., the operating speed of the photodetector 20 is substantially close to the bit rate of the optical output signal).

As mentioned above, when the photodetector current is not sampled continually, then following the timing enablement (of step 325), step 330 will include both sampling the photodetector current and converting the sample of the photodetector current to a digital value or form, as a photodetector current indicator, for use in the various extinction ratio determinations. Next, in step 335, using the input data signal, if the digital sample of the photodetector current is representative of the first logical state (logical I), such that the sample corresponds to the first optical output power level, the corresponding digital value is stored in the first holding register 35, step 340, as a first photodetector current indicator. If the digital sample of the photodetector current is not representative of the first logical state (logical 1) in step 335, and is therefore representative of the second logical state (logical 0), the corresponding digital value is stored in the second holding register 45, step 345, as a second photodetector current indicator. As a consequence, either a comparatively high or low digital value is stored in its corresponding holding register, in response to a timing (or enable) signal from the timer/CID 50, and in response to the logical state of the input data signal. It should be noted that over time, in previous iterations (with the exception of the first several iterations following system start up), another digital sample of the photodetector current, which is representative of a logical opposite, will have been stored previously in the other holding register (i.e., a second photodetector current indicator in the second holding register 45 or a first photodetector current indicator in the first holding register 35).

Using the first photodetector current indicator from the first holding register 35 (which corresponds to a first or high optical power level and represents a first logical state) and the second photodetector current indicator from the second holding register 45 (which corresponds to a second or low optical power level and represents a second logical state), the method determines (step 350) a measured extinction ratio (using extinction ratio calculator 70) by forming a ratio, namely, dividing the first photodetector current indicator by the second photodetector current indicator. In a first embodiment, each of the first and second holding registers 35, 45 may store only a single digital sample of the photodetector current per register, so that the measured extinction ratio is then calculated using one first photodetector current indicator and one second photodetector current indicator.

In another embodiment, the first and second holding registers 35, 45 may each store a plurality of samples of the photodetector current, namely, a plurality of first photodetector current indicators and a plurality of second photodetector current indicators. In that event, in step 350, the extinction ratio calculator 70 may determine the measured extinction ratio as a ratio of a first average value (or arithmetic mean) of the plurality of first photodetector current indicators to a second average value (or arithmetic mean) of the plurality of second photodetector current indicators. Use of these averaged digital values may improve the noise immunity of the operation of the apparatus 100 or 200.

Regardless of whether the measured extinction ratio value (determined by the extinction ratio calculator 70) is based upon single samples of each of the first and second photodetector current indicators, or mean values of a plurality of samples, the measured extinction ratio (of step 350) is then compared, by the extinction ratio error generator 75, to the predetermined or otherwise selected or desired extinction ratio value, to generate an extinction ratio error (step 355). The extinction ratio error represents the variance or difference (if any) between the measured extinction ratio determined from the optical output power of the laser diode 25 and the predetermined extinction ratio value. It should be noted that the extinction ratio error, as discussed above, has a sign and a magnitude (substantially equal to the variance or difference between the measured extinction ratio and the predetermined extinction ratio), and that in the event the difference or variance is zero, the extinction ratio error is also zero. It should also be noted that over time, the extinction ratio error will be forced to zero, also as discussed above, such that the laser diode output power levels provide a substantially constant, predetermined extinction ratio. Selection of the predetermined extinction ratio may be based on a number of factors, including receiver sensitivity, optical transmission loss, noise environment, etc. If the measured extinction ratio is less than the predetermined extinction ratio, the extinction ratio error is represented as a positive value, and if more than the predetermined extinction ratio, the extinction ratio error value is represented as a negative value.

Depending upon the modulator 110 (or modulator 10) configuration, the extinction ratio error, if any, may be used directly to correspondingly vary the modulation current of the laser diode 25, step 365, to provide a substantially constant, predetermined extinction ratio. As mentioned above, for the illustrated apparatus 200 embodiment, an additional step is utilized, in which the extinction ratio error, as a digital value, is summed or integrated with a plurality of previous extinction ratio errors (as a sum of a plurality of digital values from previous iterations), to form an integrated extinction ratio error, step 360. More specifically, the present extinction ratio error is effectively added to (or subtracted from) the previous integrated extinction ratio error, as a running sum. For example, if a first extinction ratio error is equivalent to +0.3 and a second extinction ratio error is equivalent to −0.08, then the integrated extinction ratio error becomes +0.22; if a third extinction ratio error is equivalent to +0.01, the integrated extinction ratio error will be+0.23; and if a fourth extinction ratio error is equivalent to 0.00, the integrated extinction ratio error will continue to be+0.23. For the illustrated embodiment, the integrated extinction ratio error is then used to correspondingly vary or provide (through DAC 85) the modulation current of the laser diode 25, step 365, to provide a substantially constant, predetermined extinction ratio. Depending upon the selected embodiment, the integrated extinction ratio error signal may be converted (e.g., scaled and converted to an analog form), as an indicator of the desired modulation current level, for use by the DAC 85 (or use directly by a modulator) to provide a corresponding level of modulation current. Again, as the extinction ratio error tends toward zero, it will be apparent that over time, any adjustment in step 365 will also become negligible or zero, with the modulation current maintained at previous levels. For the apparatus 200, of a plurality of varied or variable current paths, the DAC 85 provides a corresponding, selected current path to ground for the modulator, providing a modulation current level corresponding to the integrated extinction ratio error. The method then returns to steps 310 and 315, to continually monitor and determine the measured extinction ratio of the laser diode 25, and provide any corresponding adjustments to the modulation current.

In summary, the method of controlling an extinction ratio of a semiconductor laser, in accordance with the present invention, includes: (a) modulating the semiconductor laser at a first modulation level when the input data signal has a first logical state and modulating the semiconductor laser at a second modulation level when the input data signal has a second logical state; (b) transmitting an optical signal having a first optical power level in response to the first modulation level and having a second optical power level in response to the second modulation level, the first optical power level being greater than the second optical power level; (c) detecting the first optical power level and the second optical power level; (d) determining a measured extinction ratio as a ratio of the detected first optical power level to the detected second optical power level; (e) determining an extinction ratio error as a variance between the measured extinction ratio and a predetermined extinction ratio; and (f) using the extinction ratio error, adjusting the modulation of the semiconductor laser to generate the optical signal substantially having the predetermined extinction ratio.

The adjustment step (step (f)) may also include integrating the extinction ratio error with a plurality of previous extinction ratio errors to form an integrated extinction ratio error; and either adjusting the modulation of the semiconductor laser in response to the integrated extinction ratio error (or integrated extinction ratio error signal), or adjusting the modulation of the semiconductor laser by providing a selected current path for the modulator, with the selected current path corresponding to the integrated extinction ratio error (signal).

The optical signal detection step (step (c)) may be performed by detecting the first optical power level by sampling a first photodetector current generated by the first optical power level to form a first photodetector current indicator and detecting the second optical power level by sampling a second photodetector current generated by the second optical power level to form a second photodetector current indicator. This sampling of the first photodetector current and the second photodetector current may be performed by sampling corresponding voltage levels.

As discussed above, the measured extinction ratio may be determined as a ratio the first photodetector current indicator to the second photodetector current indicator, or as a ratio of a first arithmetic mean of a plurality of samples of the first photodetector current to a second arithmetic mean of a plurality of samples of the second photodetector current. In addition, the photodetector current levels are sampled when the input data signal has a predetermined number of consecutive identical bits (having either the first or the second logical state), or when the input data signal has one (first or second) logical state for a predetermined period of time.

As mentioned above, the feedback provided by the present invention will generally force the extinction ratio error to zero, providing a modulation current such that the laser diode 25 provides a substantially constant, predetermined extinction ratio, with minimal further adjustment of the modulation current unless and until laser operating conditions or characteristics change. As will be appreciated by those of ordinary skill in the art, the DAC 85 or an equivalent device may be configured in any number of ways to adjust or provide the modulation current through the modulator 110 or modulator 10 and the laser diode 25.

For example, if the measured extinction ratio is less than the predetermined or selected extinction ratio, providing a corresponding, positive extinction ratio error, the integrated extinction ratio error will correspondingly increase, the DAC 85 will provide for a correspondingly increased current path, which in turn, will allow more current through the modulator 110 and laser diode 25. This will result in a larger measured extinction ratio value, and a smaller extinction ratio error in subsequent iterations. If the measured extinction ratio value is greater than the predetermined or selected extinction ratio, providing a negative extinction ratio error, the integrated extinction ratio error will correspondingly decrease, the DAC 85 will provide for a correspondingly decreased current path, which in turn, will allow less current through the modulator 110 and laser diode 25. This will result in a smaller measured extinction ratio value, and a smaller extinction ratio error in subsequent iterations. In this way, operation of the extinction ratio controller 115 (via closed loop feedback) adjusts the current through the laser diode 25 until the extinction ratio error is substantially zero and the laser diode 25 provides a substantially constant, predetermined extinction ratio.

Another advantage of the present invention concerns use of the timer/CID 50 to control the timing of calculations and the corresponding bandwidth required to implement the invention. Although the methodology runs on a continuous basis, the measured extinction ratio is not calculated continuously, but only when a predetermined number of consecutive identical digits have been transmitted or the same digit has been transmitted for a predetermined period of time (based on the input data signal). As a consequence, the present invention may accommodate a lower bandwidth (compared to the frequency of data transitions or data rate) of components such as the photodetector, while maintaining accurate feedback and significant control of the semiconductor laser extinction ratio.

Yet additional advantages of the present invention may be further apparent to those of skill in the art. The various embodiments of the present invention may be advantageously combined with other aspects of laser control. For example, as illustrated in the related application, the various embodiments of the present invention may be combined with embodiments for laser midpoint control.

From the foregoing, it will be observed that numerous variations and modifications may be effected without departing from the spirit and scope of the novel concept of the invention. It is to be understood that no limitation with respect to the specific methods and apparatus illustrated herein is intended or should be inferred. It is, of course, intended to cover by the appended claims all such modifications as fall within the scope of the claims.

It is claimed:

1. An integrated circuit, the integrated circuit couplable to a semiconductor laser and to a photodetector, the photodetector optically couplable to the semiconductor laser, the semiconductor laser capable of transmitting an optical signal in response to a modulation current, and the photodetector capable of converting the optical signal into a photodetector current, the integrated circuit comprising:

a modulator couplable to the semiconductor laser, the modulator capable of providing the modulation current to the semiconductor laser, the modulation current corresponding to an input data signal; and an extinction ratio controller couplable to the photodetector and coupled to the modulator, the extinction ratio controller, in response to the photodetector current, capable of adjusting the modulation current provided by the modulator to the semiconductor laser to generate the optical signal having substantially a predetermined extinction ratio.

2. The integrated circuit of claim 1, wherein the modulator is capable of providing a first modulation current level to the semiconductor laser when the input data signal has a first logical state and providing a second modulation current level to the semiconductor laser when the input data signal has a second logical state, the first modulation current level being greater than the second modulation current level; wherein the semiconductor laser is capable of providing the optical signal having a first optical power level in response to the first modulation current level and having a second optical power level in response to the second modulation current level, the first optical power level being greater than the second optical power level; and wherein the photodetector is further capable of generating a first photodetector current level in response to the first optical power level and a second photodetector current level in response to the second optical power level.

3. The integrated circuit of claim 2, wherein the extinction ratio controller is further capable of:

sampling the first photodetector current level to form a plurality of first photodetector current indicators;

sampling the second photodetector current level to form a plurality of second photodetector current indicators;

determining a measured extinction ratio as a ratio of a first arithmetic mean of the plurality of first photodetector current indicators to a second arithmetic mean of the plurality of second photodetector current indicators;

determining a variance between the measured extinction ratio and the predetermined extinction ratio, and based on the variance, forming an extinction ratio error signal.

4. The integrated circuit of claim 3, wherein the extinction ratio controller is further capable of integrating the extinction ratio error signal with a plurality of previous extinction ratio error signals to form an integrated extinction ratio error signal; and wherein the extinction ratio controller is further capable of adjusting the modulation current by providing a selected current path for the modulator, the selected current path corresponding to the integrated extinction ratio error signal.

5. The integrated circuit of claim 2, wherein the extinction ratio controller is capable of sampling the first photodetector current level to form a first photodetector current indicator, sampling the second photodetector current level to form a second photodetector current indicator, determining a measured extinction ratio as a ratio of the first photodetector current indicator to the second photodetector current indicator, determining a variance between the measured extinction ratio and the predetermined extinction ratio and, based on the variance, forming an extinction ratio error signal.

6. The integrated circuit of claim 5, wherein the extinction ratio controller is capable of sampling the first photodetector current level and the second photodetector current level by sampling corresponding voltage levels.

7. The integrated circuit of claim 5, wherein the extinction ratio controller is enabled to sample the first photodetector current level when the input data signal has a predetermined number of consecutive bits having the first logical state and is enabled to sample the second photodetector current level when the input data signal has a predetermined number of consecutive bits having the second logical state.

8. The integrated circuit of claim 5, wherein the extinction ratio controller is enabled to sample the first photodetector current level when the input data signal has the first logical state for a predetermined period of time and is enabled to sample the second photodetector current level when the input data signal has the second logical state for the predetermined period of time.

9. The integrated circuit of claim 5, wherein the extinction ratio controller is further capable of integrating the extinction ratio error signal with a plurality of previous extinction ratio error signals to form an integrated extinction ratio error signal; and wherein the extinction ratio controller is further capable of adjusting the modulation current in response to the integrated extinction ratio error signal.

10. The integrated circuit of claim 5, wherein the extinction ratio controller is further capable of integrating the extinction ratio error signal with a plurality of previous extinction ratio error signals to form an integrated extinction ratio error signal; and wherein the extinction ratio controller is further capable of adjusting the modulation current by providing a selected current path for the modulator, the selected current path corresponding to the integrated extinction ratio error signal.

11. The integrated circuit of claim 5, wherein the extinction ratio controller is further capable of providing, in response to the extinction ratio error signal, a modulation current adjustment signal to the modulator, and wherein, in response to the Modulation current adjustment signal, the modulator is further capable of adjusting the first modulation current level and the second modulation current level for the semiconductor laser to generate the optical signal having a substantially constant, predetermined extinction ratio.

12. The integrated circuit of claim 2, wherein the extinction ratio controller further comprises:
a sampler coupled to the photodetector, the sampler capable of sampling the first photodetector current level to form a plurality of first photodetector current indicators and sampling the second photodetector current level to form a plurality of second photodetector current indicators; and
a modulation current controller coupled to the sampler and to the modulator, the modulation current controller capable of determining a measured extinction ratio as a ratio of a first arithmetic mean of the plurality of first photodetector current indicators to a second arithmetic mean of the plurality of second photodetector current indicators, and comparing the measured extinction ratio to the predetermined extinction ratio to form an extinction ratio error signal.

13. The integrated circuit of claim 2, wherein the extinction ratio controller further comprises:
a sampler coupled to the photodetector, the sampler capable of sampling the first photodetector current level to form a first photodetector current indicator and sampling the second photodetector current level to form a second photodetector current indicator; and
a modulation current controller coupled to the sampler and to the modulator, the modulation current controller capable of determining a measured extinction ratio as a ratio of the first photodetector current indicator to the second photodetector current indicator, and further capable of comparing the measured extinction ratio to the predetermined extinction ratio to form an extinction ratio error signal.

14. The integrated circuit of claim 13, wherein the sampler further comprises:
an analog-to-digital converter coupled to the photodetector, the analog-to-digital converter capable of sampling the first photodetector current level to form a first photodetector current indicator and sampling the second photodetector current level to form a second photodetector current indicator; and
a timer coupled to the analog-to-digital converter, the timer capable of enabling the analog-to-digital converter to sample the first photodetector current level when the input data signal has a predetermined number of consecutive bits having the first logical state and enabling the analog-to-digital converter to sample the second photodetector current level when the input data signal has a predetermined number of consecutive bits having the second logical state.

15. The integrated circuit of claim 13, wherein the sampler further comprises:
an analog-to-digital converter coupled to the photodetector, the analog-to-digital converter capable of sampling the first photodetector current level to form a first photodetector current indicator and sampling the second photodetector current level to form a second photodetector current indicator; and
a timer coupled to the analog-to-digital converter, the timer capable of enabling the analog-to-digital converter to sample the first photodetector current level when the input data signal has the first logical state for a predetermined period of time and enabling the analog-to-digital converter to sample the second photodetector current level when the input data signal has the second logical state for the predetermined period of time.

16. The integrated circuit of claim 13, wherein the sampler further comprises:
a first register coupled to the analog-to-digital converter, the first register capable of storing the first photodetector current indicator when the input data signal has a first logical state; and
a second register coupled to the analog-to-digital converter, the second register capable of storing the second photodetector current indicator when the input data signal has a second logical state.

17. The integrated circuit of claim 13, wherein the modulation current controller further comprises:
an extinction ratio calculator coupled to the sampler, the extinction ratio calculator capable of determining a measured extinction ratio as a ratio of the first photodetector current indicator to the second photodetector current indicator; and
an extinction ratio error generator coupled to the extinction ratio calculator, the extinction ratio error generator capable of determining a variance between the measured extinction ratio and the predetermined extinction ratio and, corresponding to the variance, forming the extinction ratio error signal.

18. The integrated circuit of claim 17, wherein the modulation current controller further comprises:
an extinction ratio integrator coupled to the extinction ratio error generator, the extinction ratio integrator capable of summing the extinction ratio error signal with a plurality of previous extinction ratio error signals to form an integrated extinction ratio error signal; and a digital-to-analog converter coupled to the extinction ratio integrator, the digital-to-analog converter capable of adjusting the modulator current by providing a selected current path for the modulator, the selected current path corresponding to the integrated extinction ratio error signal.

19. A method of controlling an extinction ratio of a semiconductor laser, the method comprising:

(a) modulating the semiconductor laser at a first modulation level when the input data signal has a first logical state and modulating the semiconductor laser at a second modulation level when the input data signal has a second logical state;

(b) transmitting an optical signal having a first optical power level in response to the first modulation level and having a second optical power level in response to the second modulation level, the first optical power level being greater than the second optical power level;

(c) detecting the first optical power level and the second optical power level;

(d) determining a measured extinction ratio as a ratio of the detected first optical power level to the detected second optical power level;

(e) determining an extinction ratio error as a variance between the measured extinction ratio and a predetermined extinction ratio; and (f) using the extinction ratio error, adjusting the modulation of the semiconductor laser to generate the optical signal having substantially the predetermined extinction ratio.

20. The method of claim 19, wherein step (f) further comprises:

integrating the extinction ratio error with a plurality of previous extinction ratio errors to form an integrated extinction ratio error; and adjusting the modulation of the semiconductor laser in response to the integrated extinction ratio error.

21. The method of claim 19, wherein step (f) further comprises:

integrating the extinction ratio error with a plurality of previous extinction ratio errors to form an integrated extinction ratio error; and adjusting the modulation of the semiconductor laser by providing a selected current path for the modulator, the selected current path corresponding to the integrated extinction ratio error.

22. The method of claim 19, wherein step (c) further comprises:

detecting the first optical power level by sampling a first photodetector current generated by the first optical power level to form a first photodetector current indicator and detecting the second optical power level by sampling a second photodetector current generated by the second optical power level to form a second photodetector current indicator.

23. The method of claim 22, wherein the sampling of the first photodetector current and the second photodetector current is performed by sampling corresponding voltage levels.

24. The method of claim 22, wherein step (d) further comprises:

determining the measured extinction ratio as a ratio of a first arithmetic mean of a plurality of samples of the first photodetector current to a second arithmetic mean of a plurality of samples of the second photodetector current.

25. The method of claim 22, wherein step (d) further comprises:

determining the measured extinction ratio as a ratio the first photodetector current indicator to the second photodetector current indicator.

26. The method of claim 22, wherein step (c) further comprises:

sampling the first photodetector current level when the input data signal has a predetermined number of consecutive bits having the first logical state and sampling the second photodetector current level when the input data signal has a predetermined number of consecutive bits having the second logical state.

27. The method of claim 22, wherein step (c) further comprises:

sampling the first photodetector current level when the input data signal has the first logical state for a predetermined period of time and sampling the second photodetector current level when the input data signal has the second logical state for the predetermined period of time.

28. An apparatus comprising:

a semiconductor laser capable of transmitting an optical signal having a first optical power level in response to a first modulation current level and having a second optical power level in response to a second modulation current level, the first optical power level being greater than the second optical power level;

a modulator coupled to the semiconductor laser, the modulator capable of providing the first modulation current level to the semiconductor laser when the input data signal has a first logical state and providing the second modulation current level to the semiconductor laser when the input data signal has a second logical state, the first modulation current level being greater than the second modulation current level;

a photodetector optically coupled to the semiconductor laser, the photodetector capable of generating a first photodetector current level in response to the first optical power level and a second photodetector current level in response to the second optical power level;

a sampler coupled to the photodetector, the sampler capable of sampling the first photodetector current level to form a first photodetector current indicator and sampling the second photodetector current level to form a second photodetector current indicator; and a modulation current controller coupled to the sampler and to the modulator, the modulation current controller capable of determining a measured extinction ratio as a ratio of the first photodetector current indicator to the second photodetector current indicator; determining a variance between the measured extinction ratio and a predetermined extinction ratio and, based on the variance, forming an extinction ratio error signal; and in response to the extinction ratio error signal, further capable of adjusting the modulation current provided by the modulator to the semiconductor laser to generate the optical signal having substantially the predetermined extinction ratio.

29. The apparatus of claim 28, wherein the sampler is further capable of sampling the first photodetector current level to form a plurality of first photodetector current indicators and sampling the second photodetector current level to form a plurality of second photodetector current indicators; and wherein the modulation current controller is further capable of determining the measured extinction ratio as a ratio of a first arithmetic mean of the plurality of first photodetector current indicators to a second arithmetic mean of the plurality of second photodetector current indicators, and determining a variance between the measured extinction ratio and the predetermined extinction ratio, and based on the variance, forming the extinction ratio error signal.

30. The apparatus of claim 28, wherein the modulation current controller is further capable of integrating the extinction ratio error signal with a plurality of previous extinction ratio error signals to form an integrated extinction ratio error signal; and wherein the modulation current controller is further capable of adjusting the modulation current by providing a selected current path for the modulator, the selected current path corresponding to the integrated extinction ratio error signal.

31. The apparatus of claim 28, wherein the sampler further comprises:

a timer capable of enabling the sampling of the first photodetector current level when the input data signal has a predetermined number of consecutive bits having the first logical state and enabling the sampling of the second photodetector current level when the input data signal has a predetermined number of consecutive bits having the second logical state.

32. The apparatus of claim 28, wherein the sampler further comprises:

a timer capable of enabling the sampling of the first photodetector current level when the input data signal has the first logical state for a predetermined period of time and enabling the sampling of the second photodetector current level when the input data signal has the second logical state for the predetermined period of time.

33. The apparatus of claim 28, wherein the modulation current controller is further capable of providing, in response to the extinction ratio error signal, a modulation current adjustment signal to the modulator, and wherein, in response to the modulation current adjustment signal, the modulator is further capable of adjusting the first modulation current level and the second modulation current level for the semiconductor laser to generate the optical signal having substantially the predetermined extinction ratio.

34. The apparatus of claim 28, wherein the sampler further comprises:

a first register capable of storing the first photodetector current indicator when the input data signal has a first logical state; and a second register capable of storing the second photodetector current indicator when the input data signal has a second logical state.

* * * * *